United States Patent
Subasingha et al.

(10) Patent No.: US 9,680,507 B2
(45) Date of Patent: Jun. 13, 2017

(54) OFFSET SELECTION FOR ERROR CORRECTION DATA

(71) Applicant: QUALCOMM Incorporated, San Diego, CA (US)

(72) Inventors: Subasingha Shaminda Subasingha, San Diego, CA (US); Venkatesh Krishnan, San Diego, CA (US); Vivek Rajendran, San Diego, CA (US); Venkatraman S. Atti, San Diego, CA (US); Chandra Mouli Polisetty, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 51 days.

(21) Appl. No.: 14/749,474

(22) Filed: Jun. 24, 2015

(65) Prior Publication Data

US 2016/0028418 A1    Jan. 28, 2016

Related U.S. Application Data

(60) Provisional application No. 62/027,595, filed on Jul. 22, 2014, provisional application No. 62/042,013, filed on Aug. 26, 2014.

(51) Int. Cl.

| | |
|---|---|
| *H04L 1/00* | (2006.01) |
| *H03M 13/35* | (2006.01) |
| *H04L 1/20* | (2006.01) |
| *H04L 12/26* | (2006.01) |

(52) U.S. Cl.
CPC ........ *H03M 13/353* (2013.01); *H04L 1/0006* (2013.01); *H04L 1/0026* (2013.01); *H04L 1/0041* (2013.01); *H04L 1/205* (2013.01); *H04L 43/087* (2013.01)

(58) Field of Classification Search
CPC .......................................... H04L 1/00
USPC ................................ 714/776, 774, 788, 786
See application file for complete search history.

(56) References Cited

U.S. PATENT DOCUMENTS

| | | | |
|---|---|---|---|
| 6,661,811 B1 * | 12/2003 | Baker | ................... H04J 3/0632 370/516 |
| 6,678,339 B1 * | 1/2004 | Lashkarian | ......... H04L 27/2657 370/208 |
| 8,352,252 B2 | 1/2013 | Fang et al. | |
| 8,428,938 B2 | 4/2013 | Fang et al. | |

(Continued)

FOREIGN PATENT DOCUMENTS

| | | |
|---|---|---|
| WO | 03023707 A2 | 3/2003 |
| WO | 2009000821 A1 | 12/2008 |
| WO | 2010141762 A1 | 12/2010 |

OTHER PUBLICATIONS

International Search Report and Written Opinion of the International Searching Authority (EPO) for International Application No. PCT/US2015/037789, mailed Sep. 4, 2015, 11 pages.

*Primary Examiner* — Fritz Alphonse
(74) *Attorney, Agent, or Firm* — Toler Law Group, PC

(57) ABSTRACT

A method includes determining, at a decoder of a first device, an offset value corresponding to an offset between a first particular packet and a second particular packet. The first device includes a de-jitter buffer. The method also includes transmitting the offset value to an encoder of a second device to enable the second device to send packets to the first device based on the offset value.

41 Claims, 7 Drawing Sheets

(56) References Cited

U.S. PATENT DOCUMENTS

| | | |
|---|---|---|
| 9,053,702 B2 | 6/2015 | Rajendran et al. |
| 9,332,492 B2 * | 5/2016 | Sleator ................. H04W 52/02 |
| 2002/0136112 A1 * | 9/2002 | Kadlec ................. G11B 7/0945 |
| | | 369/44.29 |
| 2002/0145953 A1 * | 10/2002 | Kadlec ................. G11B 7/0945 |
| | | 369/44.29 |
| 2008/0267224 A1 | 10/2008 | Kapoor et al. |
| 2010/0002792 A1 * | 1/2010 | Seyedi-Esfahani ... H04L 5/0007 |
| | | 375/260 |
| 2013/0185062 A1 | 7/2013 | Krishnan et al. |
| 2013/0191121 A1 | 7/2013 | Rajendran et al. |
| 2016/0036560 A1 | 2/2016 | Krishnan et al. |
| 2016/0036564 A1 | 2/2016 | Krishnan et al. |

* cited by examiner

OFFSET SELECTION FOR ERROR CORRECTION DATA

I. CLAIM OF PRIORITY

This application claims priority from U.S. Provisional Patent Application No. 62/027,595 filed on Jul. 22, 2014, and entitled "OFFSET SELECTION FOR ERROR CORRECTION DATA," and from U.S. Provisional Patent Application No. 62/042,013 filed on Aug. 26, 2014, and entitled "OFFSET SELECTION FOR ERROR CORRECTION DATA," the contents of which are incorporated herein in their entirety.

II. FIELD

The present disclosure is generally related to offset selection for error correction data.

III. DESCRIPTION OF RELATED ART

Advances in technology have resulted in smaller and more powerful computing devices. For example, there currently exist a variety of portable personal computing devices, including wireless telephones such as mobile and smart phones, tablets, and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

A source device (e.g., a first electronic device) my send packets to a destination device (e.g., a second electronic device). Due to network conditions, the packets may arrive out of order at the destination device. The destination device may store received packets in a de-jitter buffer and may rearrange the received packets if the received packets are out-of-order. The destination device may reconstruct data based on the received packets. A particular packet sent by the source device may not be received, or may be received with errors, by a destination device. The destination device may be unable to recover all or a portion of the data associated with the particular packet.

IV. SUMMARY

According to one implementation, a method includes determining, at a decoder of a first device, an offset value corresponding to an offset between a first particular packet and a second particular packet. The first device includes a de-jitter buffer. In certain scenarios, the particular packet may be in the de-jitter buffer and the offset value may be determined based on a statistical measure of packets received by the de-jitter buffer. The method also includes transmitting the offset value to an encoder of a second device to enable the second device to send packets to the first device based on the offset value.

According to another implementation, a device includes a de-jitter buffer configured to store one or more packets. The device also includes a decoder configured to determine an offset value corresponding to an offset between a first particular packet and a second particular packet. In certain scenarios, the particular packet may be in the de-jitter buffer and the offset value may be determined based on a statistical measure of packets received by the de-jitter buffer. The device further includes a transmitter configured to transmit the offset value to a second device to enable the second device to send packets to the device based on the offset value.

According to another implementation, a non-transitory computer-readable medium includes instructions that, when executed by a first device, causes the first device to determine an offset value corresponding to an offset between a first particular packet and a second particular packet. The first device includes a de-jitter buffer. In certain scenarios, the particular packet may be in the de-jitter buffer and the offset value may be determined based a statistical measure of packets received by the de-jitter buffer. The instructions are also executable to cause the first device to transmit the offset value to a second device to enable the second device to send packets to the first device based on the offset value.

According to another implementation, a device includes means for storing one or more packets and means for determining an offset value corresponding to an offset between a first particular packet and a second particular packet. In certain scenarios, the particular packet may be in the means for storing one or more packets and the offset value is determined based on a statistical measure of packets received by the means for storing one or more packets. The device also includes means for transmitting the offset value to a second device to enable the second device to send packets to the device based on the offset value.

V. BRIEF DESCRIPTION OF THE DRAWINGS

VI. DETAILED DESCRIPTION

Figure 1:
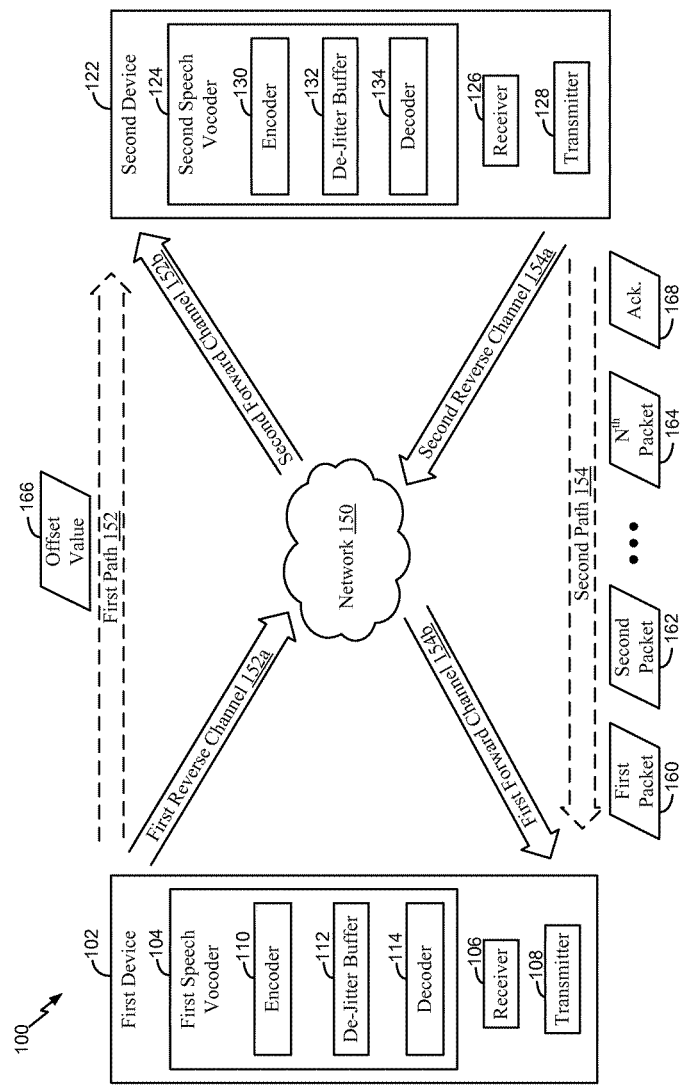
FIG. 1 is a system that is operable to determine an offset value to retrieve partial redundancy information of a packet.

The principles described herein may be applied, for example, to a headset, a handset, or other audio device that is configured to perform redundancy based packet transmission error recovery. Unless expressly limited by its context, the term "signal" is used herein to indicate any of its ordinary meanings, including a state of a memory location (or set of memory locations) as expressed on a wire, bus, or other transmission medium. Unless expressly limited by its context, the term "generating" is used herein to indicate any of its ordinary meanings, such as computing or otherwise producing. Unless expressly limited by its context, the term "calculating" is used herein to indicate any of its ordinary meanings, such as computing, evaluating, smoothing, and/or selecting from a plurality of values. Unless expressly limited by its context, the term "obtaining" is used to indicate any of its ordinary meanings, such as calculating, deriving, receiving (e.g., from another component, block or device), and/or retrieving (e.g., from a memory register or an array of storage elements).

Unless expressly limited by its context, the term "producing" is used to indicate any of its ordinary meanings, such as calculating, generating, and/or providing. Unless expressly limited by its context, the term "providing" is used to indicate any of its ordinary meanings, such as calculating, generating, and/or producing. Unless expressly limited by its context, the term "coupled" is used to indicate a direct or indirect electrical or physical connection. If the connection is indirect, it is well understood by a person having ordinary skill in the art, that there may be other blocks or components between the structures being "coupled".

The term "configuration" may be used in reference to a method, apparatus/device, and/or system as indicated by its particular context. Where the term "comprising" is used in the present description and claims, it does not exclude other elements or operations. The term "based on" (as in "A is based on B") is used to indicate any of its ordinary meanings, including the cases (i) "based on at least" (e.g., "A is based on at least B") and, if appropriate in the particular context, (ii) "equal to" (e.g., "A is equal to B"). In the case (i) where A is based on B includes based on at least, this may include the configuration where A is coupled to B. Similarly, the term "in response to" is used to indicate any of its ordinary meanings, including "in response to at least." The term "at least one" is used to indicate any of its ordinary meanings, including "one or more". The term "at least two" is used to indicate any of its ordinary meanings, including "two or more".

The terms "apparatus" and "device" are used generically and interchangeably unless otherwise indicated by the particular context. Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The terms "method," "process," "procedure," and "technique" are used generically and interchangeably unless otherwise indicated by the particular context. The terms "element" and "module" may be used to indicate a portion of a greater configuration. Any incorporation by reference of a portion of a document shall also be understood to incorporate definitions of terms or variables that are referenced within the portion, where such definitions appear elsewhere in the document, as well as any figures referenced in the incorporated portion.

As used herein, the term "communication device" refers to an electronic device that may be used for voice and/or data communication over a wireless communication network. Examples of communication devices include cellular phones, personal digital assistants (PDAs), handheld devices, headsets, wireless modems, laptop computers, personal computers, etc. The devices described herein may be compatible with one or more mobile telecommunication technologies. For example, the devices described herein may be compatible with third generation (3G) mobile telecommunication technologies, fourth generation (4G) mobile telecommunication technologies, and/or fifth generation (5G) mobile telecommunication technologies. Additionally, or in the alternative, the devices described herein may be compatible with different standards (e.g., a Long-Term Evolution (LTE) wireless communication standard, a LTE-A wireless communication standard, a Worldwide Interoperability for Microwave Access (WiMAX) wireless communication standard, etc.).

Referring to FIG. 1, a system that is operable to determine an offset value to retrieve partial redundancy information of a lost packet is disclosed and generally designated 100. The system 100 includes a first device 102 in communication with one or more other devices (e.g., a second device 122) via a network 150. The first device 102 may send data to the second device 122 via the network 150 using a first path 152, and the second device 122 may send data to the first device 102 via the network 150 using a second path 154.

The first device 102 may communicate with the network 150 via a first reverse channel 152a (e.g., a first reverse link) and a first forward channel 154b (e.g., a first forward link). For example, the first device 102 may transmit data to the network 150 using the first reverse channel 152a, and the first device 102 may receive data from the network 150 using the first forward channel 154b. The second device 122 may communicate with the network 150 via a second reverse channel 154a (e.g., a second reverse link) and a second forward channel 152b (e.g., a second forward link). For example, the second device 122 may transmit data to the network 150 using the second reverse channel 154a, and the second device 122 may receive data from the network 150 using the second forward channel 152b.

The network 150 may include one or more base stations or access points to communicate data between the first device 102 and the second device 122. As used herein, data (e.g., packets, frames, offset values, acknowledgements, etc.) communicated via the first path 152 corresponds to data transmitted from the first device 102 to the network 150 via the first reverse channel 152a and received at the second device 122 from the network 150 via the second forward channel 152b. In a similar manner, data communicated via the second path 154 corresponds to data transmitted from the second device 122 to the network 150 via the second reverse channel 154a and received at the first device 102 from the network 150 via the first forward channel 154b.

The devices 102, 122 may include fewer or more components than illustrated in FIG. 1. For example, the devices 102, 122 may include one or more processors, one or more memory units, or both. According to one implementation, the first device 102 and/or the second device 122 may be a smart phone, a cellular phone, a mobile communication device, a laptop computer, a computer, a tablet, a PDA, a set top box, a video player, an entertainment unit, a display device, a television, a gaming console, a music player, a radio, a digital video player, a digital video disc (DVD) player, a tuner, a camera, a navigation device, or a combination thereof. Such devices may include a user interface (e.g., a touch screen, voice recognition capability, or other user interface capabilities).

The first device 102 includes a first speech vocoder 104, a receiver 106, and a transmitter 108. The first speech vocoder 104 includes an encoder 110, a de-jitter buffer 112, and a decoder 114. The second device 122 includes a second speech vocoder 124, a receiver 126, and a transmitter 128. The second speech vocoder 124 includes an encoder 130, a de-jitter buffer 132, and a decoder 134. As described herein, the first device 102 will be described as a "receiving terminal" and the second device 122 will be described as a "transmitting terminal." For example, the second device 122 may transmit packets that are received by the first device 102. However, in other implementations, each device 102, 122 may concurrently operate as a receiving terminal and a transmitting terminal. For example, the first device 102 may transmit packets to the second device 122 via the first path 152 (e.g., transmit packets to the network 150 via the first reverse channel 152a) and concurrently receive packets from the second device 122 via the second path 154 (e.g., receive packets from the network 150 via the first forward channel 154b). Additionally, the second device 122 may transmit packets to the first device 102 via the second path 154 (e.g., transmit packets to the network 150 via the second reverse channel 154a) and concurrently receive packets from the first device 102 via the first path 152 (e.g., receive packets from the network 150 via the second forward channel 152b).

The receiver 106 may be configured to receive data (e.g., one or more packets) from the second device 122 via the second path 154. To illustrate, the transmitter 128 may be configured to transmit a first packet 160, a second packet 162, and an Nth packet 164 to the network 150 via the second reverse channel 154a. The receiver 106 may be configured to receive the first packet 160, the second packet 162, and the Nth packet 164 from the network 150 via the first forward channel 154b. N may be any integer value that is greater than zero. For example, if N is equal to twelve, twelve packets may be communicated from the second device 122 to the first device 102 via the second path 154.

The receiver 106 may provide the received packets 160-164 to the de-jitter buffer 112. The de-jitter buffer 112 may be configured to store (e.g., buffer) the packets 160-164 received by the receiver 106. To illustrate, the de-jitter buffer 112 may have a storage capacity (e.g., a "depth") to store a number "D" of packets. The packets 160-164 may arrive out of order due to the dynamic nature of the wireless network 150. For example, the second packet 162 may arrive at the receiver 106 prior to the first packet 160 arriving at the receiver 106 due to a network delay, a data handling capacity, wireless signal conditions, a network load, etc. The de-jitter buffer 112 may be configured to "absorb" or reduce the jitter (e.g., the delay) in the packet arrival time by buffering the packets 160-164 received by the receiver 106 and providing a packet the decoder 114 at regular intervals (e.g., approximately once every 20 milliseconds (ms)).

The decoder 114 may reorder one or more of the packets 160-164 in the de-jitter buffer 112 if the packets 160-164 are out-of-order. Additionally, one or more packets 160-164 sent by the second device 122 may not be received, or may be received with errors, by the first device 102. For example, a packet (e.g., the first packet 160) may not be received due to packet loss or may be partially received, due to network conditions, by the receiver 106. The decoder 114 may determine whether a particular packet is missing from the de-jitter buffer 112.

To circumvent problems at the decoder 114 caused by a lost packet (or a packet received with errors), subsequent packets may include error correction data associated with the lost packet. According to one implementation, the error correction data may include a partial copy of the lost packet. Thus, the decoder 114 may retrieve a subsequent packet (having error correction data associated with the lost packet) from the de-jitter buffer 112 in response to determining that the lost packet is missing from the de-jitter buffer 112.

For example, if the decoder 114 determines that the first packet 160 (e.g., a "current frame") is missing from the de-jitter buffer 112 (or includes errors) when the decoder 114 attempts to retrieve the first packet 160 from the de-jitter buffer 112 and decode the first packet 160, the decoder 114 may determine whether a subsequent packet (that includes error correction data or partial redundancy associated with the first packet 160) is stored in the de-jitter buffer 112.

Figure 2:
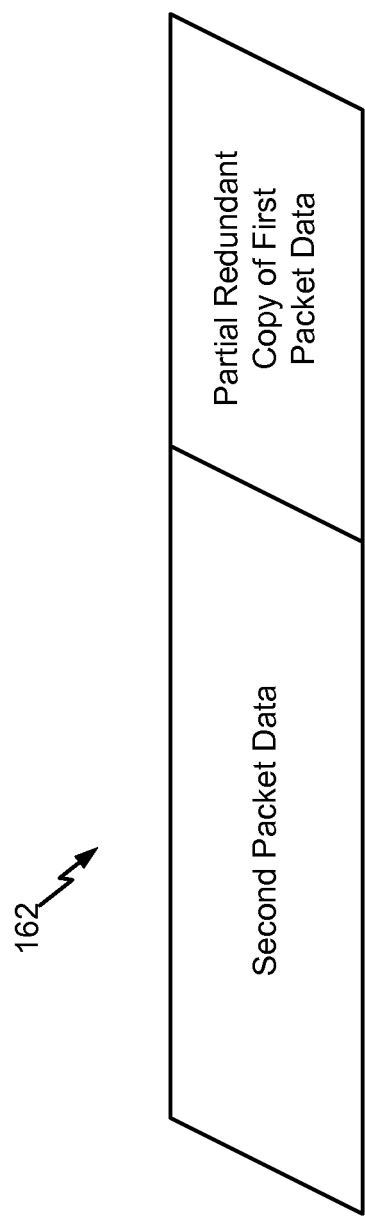
FIG. 2 is a packet that includes a partial copy of a packet sent at an earlier time.

To illustrate, the second packet 162 may include a partial copy of the first packet 160. Referring to FIG. 2, the second packet 162 may include second packet data and a partial redundant copy of first packet data associated with the first packet 160. Thus, a partial redundant copy of a current frame (e.g., the first packet 160) may be multiplexed with a subsequent frame (e.g., the second packet 162). If the partial copy of the current frame is added to a subsequent frame that is transmitted no more than "D" time units after the current frame, then there is a relatively high likelihood that the subsequent frame will be in the de-jitter buffer 112 when the decoder 114 attempts to decode the current frame. Thus, with reference to FIGS. 1-2, if the partial redundant copy of the first packet data is added to the second packet 162, then there is a relatively high likelihood that the second packet 162 will be in the de-jitter buffer 112 (when the decoder 114 attempts to decode the first packet 160) if the second packet 162 is transmitted no more than "D" time units after the first packet 160.

The decoder 114 may be configured to poll the de-jitter buffer 112 to determine whether a subsequent packet (that includes error correction data or partial redundancy associated with the first packet 160) is stored in the de-jitter buffer 112. For example, the decoder 114 may poll the de-jitter buffer 112 for the second packet 162. If the second packet 162 is available in the de-jitter buffer 112, the decoder 114 may use the redundant copy of first packet data (in the second packet 162) to synthesize the first packet 160, which may result in significant quality improvement as opposed to erasure concealment (e.g., skipping decoding functions associated with the first packet 160).

The possibility of "recovering" a lost packet (e.g., the first packet 160) based on the partial copy of the first packet 160 in a subsequent packet (e.g., the second packet 162) depends on whether the subsequent packet is available in the de-jitter buffer 112. Based on a statistical measure of packets received by the de-jitter buffer 112 (e.g., a polling history of the de-jitter buffer 112), the decoder 114 may determine and dynamically adjust an offset value ("X") (e.g., a FEC offset value) between a current packet and a subsequent packet having a partial copy of the current packet, as described with respect to FIG. 3.

For example, each packet 160-164 may include a sequence number corresponding to the order in which the packet 160-164 is transmitted from the second device 122. As a non-limiting example, the first packet 160 may include the sequence number "1", the second packet 162 may include the sequence number "2", the Nth packet 164 may include the sequence number "N", etc. The offset value ("X") between the current frame (e.g., the first packet 160) and a subsequent frame that includes error correction data associated with the current frame (e.g., the second packet 162) corresponds to the difference between the sequence number of the current frame and the sequence number of the subsequent frame.

According to one implementation, two bits may be allocated in a packet to indicate the offset value ("X"). The two bits may correspond to one of four possible offset values (e.g., two, three, five, or seven). To illustrate, if the two bits allocated in the packet indicate "00", the offset value may be equal to two. If the two bits allocated in the packet indicate "01", the offset value may be equal to three. If the two bits allocated in the packet indicate "10", the offset value may be equal to five. If the two bits allocated in the packet indicate "11", the offset value may be equal to seven.

Figure 3:
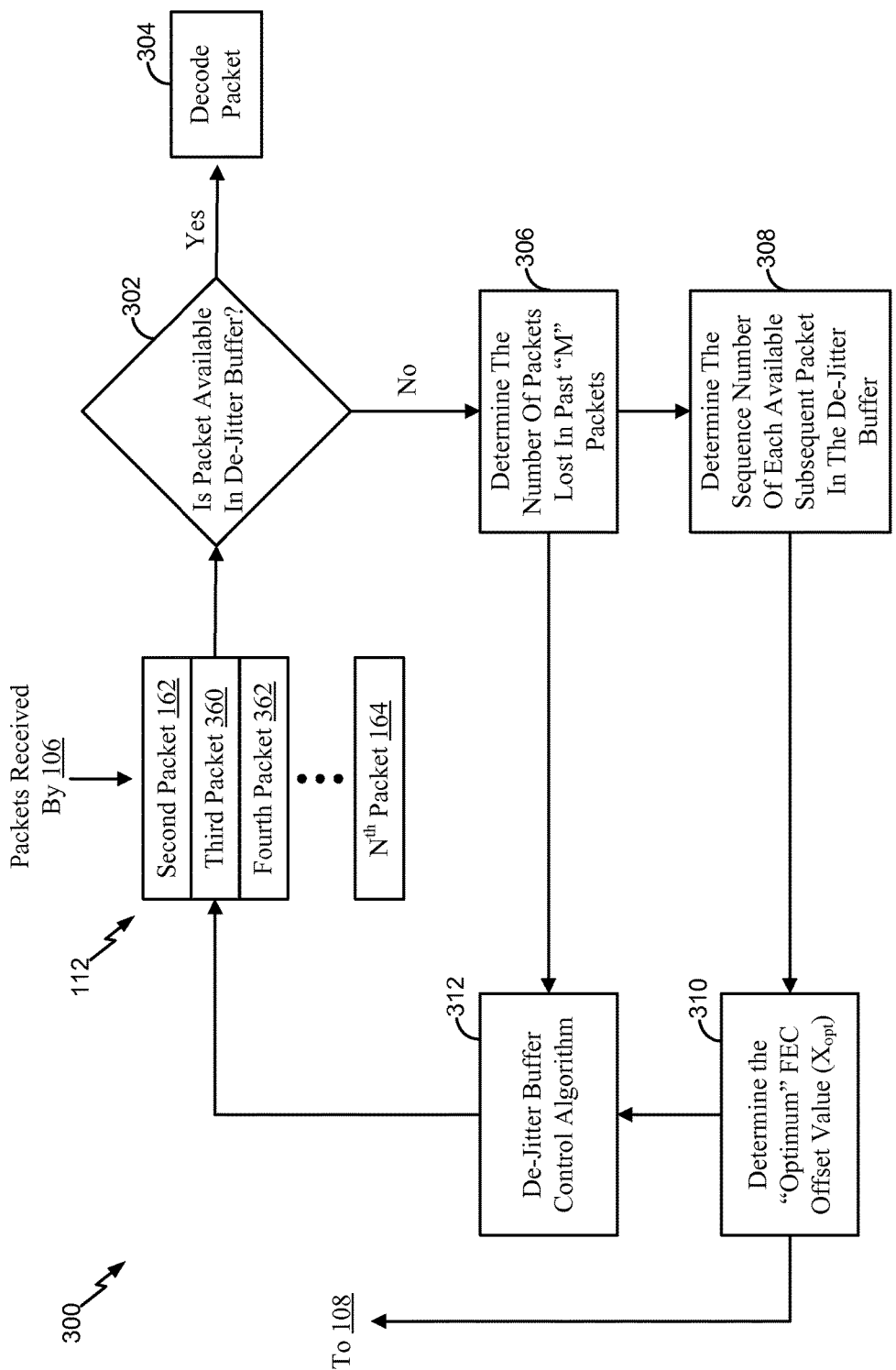
FIG. 3 is a process diagram of a method that is operable to determine an offset value to improve lost packet recovery.

Referring to FIG. 3, a process diagram 300 illustrates a method that is operable to determine an offset value to improve lost packet recovery using components of the first speech vocoder 104. The process diagram 300 depicts the de-jitter buffer 112 and a plurality of process steps 302-312. Each process step 302-312 may be performed by the decoder 114 of the first speech vocoder 104.

The receiver 106 may provide the second packet 162, a third packet 360, a fourth packet 362, and the Nth packet 164 to the de-jitter buffer 112. At 302, the decoder 114 may determine whether the first packet 160 (e.g., a first speech frame) is available in the de-jitter buffer 112. For example, the decoder 114 may poll the de-jitter buffer 112 for the first packet 160. If the decoder 114 determines that the first packet 160 is available in the de-jitter buffer 112, the decoder 114 may decode the first packet 160, at 304.

If the decoder 114 determines that the first packet 160 is not available in the de-jitter buffer 112, the decoder 114 may poll the de-jitter buffer 112 for a subsequent packet that includes error correction data associated with the first packet 160 (e.g., poll the de-jitter buffer 112 for the second packet 162) and decode the subsequent packet, at 304. Additionally, the decoder 114 may determine/update an offset value to improve lost packet recovery in response to a determination that the first packet 160 is not available in the de-jitter buffer 112.

For example, the decoder 114 may determine a number of packets that were lost (or that included errors) in the past "M" packets, at 306, where M is any integer greater than one. For example, if M is equal to twenty, the decoder 114 may determine the number of packets that were lost in the past twenty packets, at 306. The number of lost packets in the past M packets may be provided to a processor that implements a de-jitter buffer control algorithm, at 312.

Additionally, the decoder 114 may determine the sequence number of each available subsequent packet in the de-jitter buffer 112, at 308. For example, the decoder 114 may determine the sequence number of the second packet 162, the sequence number of the third packet 360, the sequence number of the fourth packet 362, the sequence number of the Nth packet 164, etc.

The decoder 114 may determine a particular offset value (e.g., an "optimum" FEC offset value ($X_{opt}$)) based on a history of offset values of packets that are in the de-jitter buffer 112 upon the occurrence of lost packets, at 310. The determination may be based on the sequence numbers of each packet in the de-jitter buffer 112, at 308. According to one implementation, the decoder 114 may use a probability mass function $P(x|L)$ to determine the optimum FEC offset value ($X_{opt}$). The probability mass function $P(x|L)$ may be expressed as:

$$P(x \mid L) = \frac{\sum_{k=1}^{K} \Phi_k(x)}{\sum_{y=1}^{D} \sum_{k=1}^{K} \Phi_k(y)} \quad \text{(Equation 1)}$$

where k corresponds to the lost packet (e.g., the first packet 160), K corresponds to all of the lost packets within a particular period, L corresponds to all of the lost packets within the particular period and all the packets within the de-jitter buffer 112 within the particular period, and $\Phi_k(x)$ corresponds to an indicator function as to whether a packet is in the de-jitter buffer 112. For example, $\Phi_k(x)$ may be expressed as:

$$\Phi_k(x) = \begin{cases} 1; & \text{if packet } k+x \text{ is available in the buffer} \\ 0; & \text{if packet } k+x \text{ is not in the buffer} \end{cases} \quad \text{(Equation 2)}$$

Thus, the numerator of Equation 1 may track (e.g., sum) instances of packets having the offset (x) to each lost packet being in the de-jitter buffer 112 during the particular period. With reference to the denominator of Equation 1, D may correspond to the depth of the de-jitter buffer 112. Thus, the denominator of Equation 1 may provide a normalization value (e.g., the value of all of the possible offsets within the particular period).

The optimum FEC offset value ($X_{opt}$) may be computed by determining the maximum offset (x) (e.g., the offset that occurs most frequently in the particular period). For example, the optimum offset value ($X_{opt}$) may be expressed as:

$$X_{opt} = \mathrm{argmax} P(x|L) \quad \text{(Equation 3)}$$

Storing the error correction data of the lost packet (k) (e.g., the first packet 160) in a subsequent packet that has a sequence number offset from the lost packet (k) by the optimum FEC offset value ($X_{opt}$) may increase the likelihood that error correction data for the lost packet (k) is in the de-jitter buffer 112. Thus, the computation of the particular offset value (e.g., the optimum FEC offset value ($X_{opt}$)) may be performed such that a relatively high number (e.g., a maximum number) of packet erasures may be recovered using redundant copies of packet data based on packet erasure statistics of a finite history of previous packet erasures.

The optimum FEC offset value ($X_{opt}$) may be provided to the transmitter 108 of FIG. 1 to be transmitted to the encoder 130 of the second device 122, as described below. The optimum FEC offset value ($X_{opt}$) may also be provided to the processor that implements the de-jitter buffer control algorithm, at 312. The de-jitter buffer control algorithm may be configured to adjust the depth (D) of the de-jitter buffer 112 based on the number of lost packets and the optimum FEC offset value ($X_{opt}$) to achieve a tradeoff between delay and packet losses.

Referring back to FIG. 1, the decoder 114 may provide an offset value 166 (e.g., the optimum FEC offset value ($X_{opt}$)) to the transmitter 108, and the transmitter 108 may transmit the offset value 166 to the receiver 126 of the second device 122.

According to another implementation, the decoder 114 may determine the "optimum" FEC offset value ($X_{opt}$) by iteratively setting the offset value 166 to each of several trial values and transmitting the trial value to the second device 122 (e.g., the encoder 130) as the offset value 166. Based on communications between the encoder 130 and the decoder 114 using the different trial values, the decoder 114 may determine the probability, for each trial value, of recovering a partial redundant copy of a lost packet.

As a non-limiting example, the decoder 114 may set the offset value 166 to "1" (e.g., a minimum offset value) and transmit the offset value 166 to the encoder 130. Based on the offset value 166, the encoder 130 may provide a partial redundant copy for a particular packet in a next subsequent packet. Each time the decoder 114 attempts to decode a lost packet, the decoder 114 may poll the de-jitter buffer 112 to determine whether a "redundant packet" of the lost packet (e.g., a packet that includes a partial redundant copy of the lost packet) is in the de-jitter buffer 112 (e.g., poll the de-jitter buffer 112 for a packet having a sequence number that is offset from sequence number of the lost packet by one). If the redundant packet is in the de-jitter buffer 112, the probability of successfully decoding lost packets increases for the offset value 166 having a value of "1". If the redundant packet is not in the de-jitter buffer 112, the probability of successfully decoding lost packets decreases for the offset value 166 having the value of "1". For example, the probability may be equal to the number of times a redundant packet is in the de-jitter buffer 112 when a lost packet is detected divided by the number of detected lost packets.

After a particular time period (or after attempting to decode a particular number of lost packets), the decoder 114 may increment the offset value 166 to "2" and transmit the offset value 166 to the encoder 130. Based on the incremented offset value 166, the encoder 130 may provide a partial redundant copy for a particular packet in a subsequent packet offset from the particular packet by two. In a similar manner, when the decoder 114 attempts to decode a lost packet, the decoder 114 may poll the de-jitter buffer 112 to determine whether a redundant packet of the lost packet is in the de-jitter buffer 112. Upon determining the probability of successfully decoding a lost packet for an offset value 166 of two, the process may be repeated for additional offset values. The optimum FEC offset value ($X_{opt}$) may correspond to the offset value 166 that yields the greatest probability of successfully decoding a lost packet.

Although the above example corresponds to incrementing the offset value 166, in other implementations, the decoder 114 may set the initial value to a "maximum value" and decrement the offset value 166. As a non-limiting example, the decoder 114 may set the offset value 166 to "20", determine the probability of successfully decoding a lost packet for when the offset value 166 is "20", decrement the offset value 166 to "19", and repeat. Additionally, although the above examples describe incrementing (or decrementing) the offset value 166 by one, in other implementations, the offset value 166 may be incremented (or decremented) by other values. As a non-limiting example, the offset value 166 may be incremented (or decremented) by two, three, four, five, etc.

Figure 4:
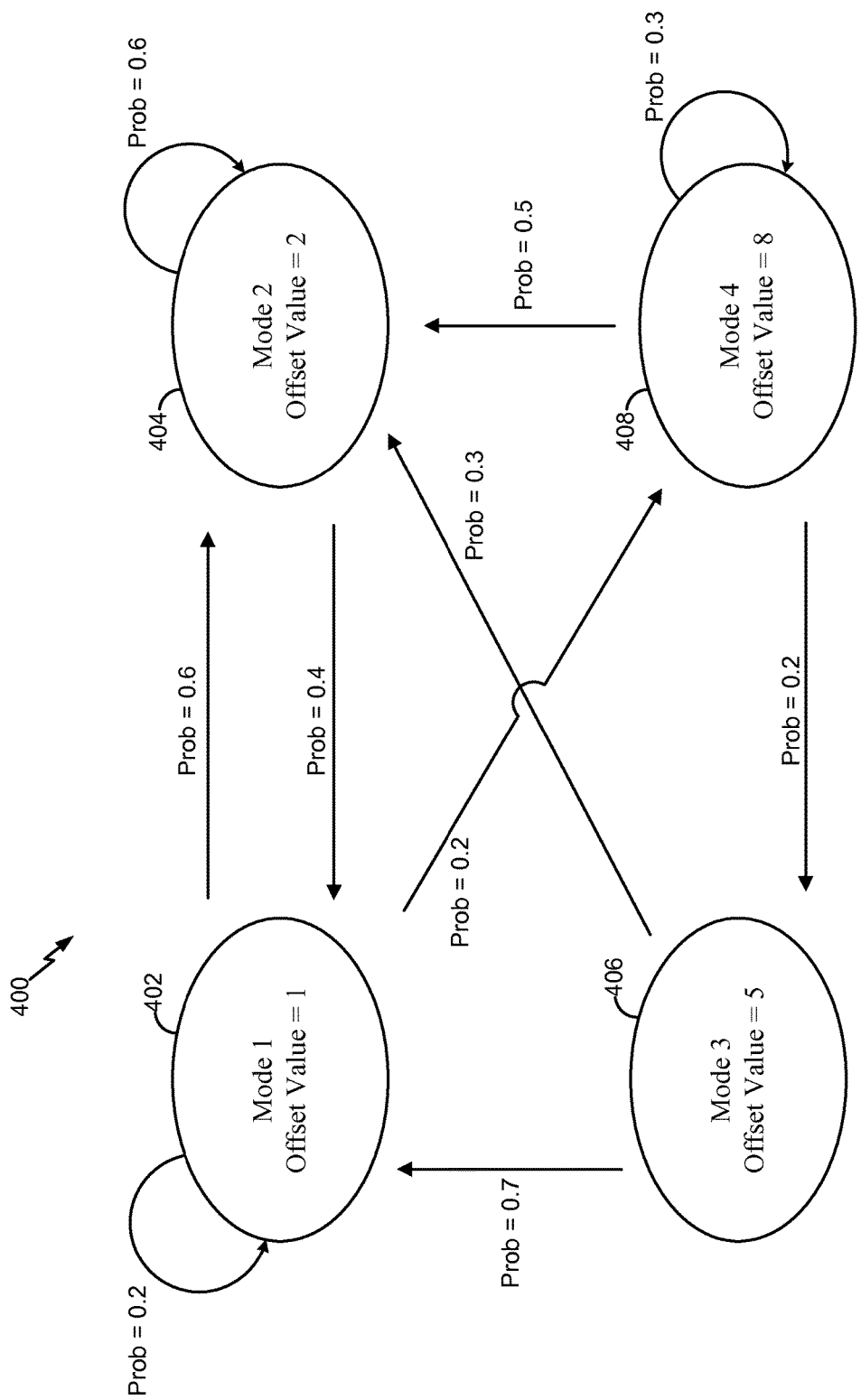
FIG. 4 is a state diagram for determining an offset value to improve lost packet recovery.

Referring to FIG. 4, a state diagram 400 for determining an offset value to improve lost packet recovery is shown. The state diagram 400 may be based on a prediction model (e.g., a hidden Markov model or a Bayesian network) to preemptively predict the optimum FEC offset value ($X_{opt}$) (e.g., the offset value 166) based on channel characteristics.

The state diagram 400 may include a first mode (Mode 1) 402, a second mode (Mode 2) 404, a third mode (Mode 3) 406, and a fourth mode (Mode 4) 408. Each mode 402-408 may correspond to a channel characteristic (e.g., signal strength, cell location, moving characteristic, etc.). As a non-limiting example, the first mode 402 may correspond to a channel having a "strong" signal strength, the second mode 404 may correspond to a channel having a "relatively strong" signal strength, the third mode 406 may correspond to a channel having a "relatively weak" signal strength, and the fourth mode 408 may correspond to a channel having a "weak" signal strength.

As another example, each mode 402-408 may correspond to an environment of the first device 102. To illustrate, the first mode 402 may correspond to when the first device 102 is in an outdoor area with strong signal reception and the fourth mode 408 may correspond to an area with moderate signal strength and multiple signal paths (e.g., a basement). Alternatively, or in addition, each mode 402-408 may correspond to a location of the first device 102 with respect to one or more cell towers. For example, the first mode 402 may correspond to when the first device 102 is relatively close to a cell tower and the fourth mode 408 may correspond to when the first device 102 is transitioning between cell tower coverage.

If the first device 102 of FIG. 1 is operating in the first mode 402, the offset value 166 (e.g., the optimum FEC offset value ($X_{opt}$)) may be equal to one. For example, the second device 122 may encode a partial redundant copy of a particular packet in a next subsequent packet, and the probability that the next subsequent packet is stored in the de-jitter buffer 112 if the particular packet is lost is relatively high.

The first device 102 may use the state diagram 400 to predict (e.g., determine) a future state (e.g., a future mode) and the offset value 166 corresponding to the future state. As a non-limiting example, if the first device 102 is in the first mode 402, there may be a 60 percent probability that the first device 102 transitions into the second mode 404. Thus, the first device 102 may send an offset value 166 of "two" to the second device 122 to indicate the change in offset to the encoder 130.

The probabilities and modes in the state diagram 400 are for illustrative purposes and are not intended to be limiting. According to one implementation, the probabilities may dynamically change based on previous attempts to decode a lost packet. Using a state transition model such as illustrated by the state diagram 400 of FIG. 4 may enable the first device 102 to preemptively set the offset value 166 based on a mode of operation to increase the probability of decoding a lost packet. Although the states are described as distinct channel conditions, in other implementations, the states may instead be defined in terms of optimal offset values. For example, various distinct channel conditions may each correspond to a same optimum offset value and therefore would correspond to a single state in the state diagram 400.

Referring back to FIG. 1, the transmitter 108 may transmit the offset value 166 to the receiver 126 of the second device 122 via the first path 152 using in-band signaling or out-of-band signaling. To illustrate, the transmitter 108 may transmit the offset value 166 to the network 150 via the first reverse channel 152a, and the receiver 126 may receive the offset value 166 from the network 150 via the second forward channel 152b.

Figure 5:
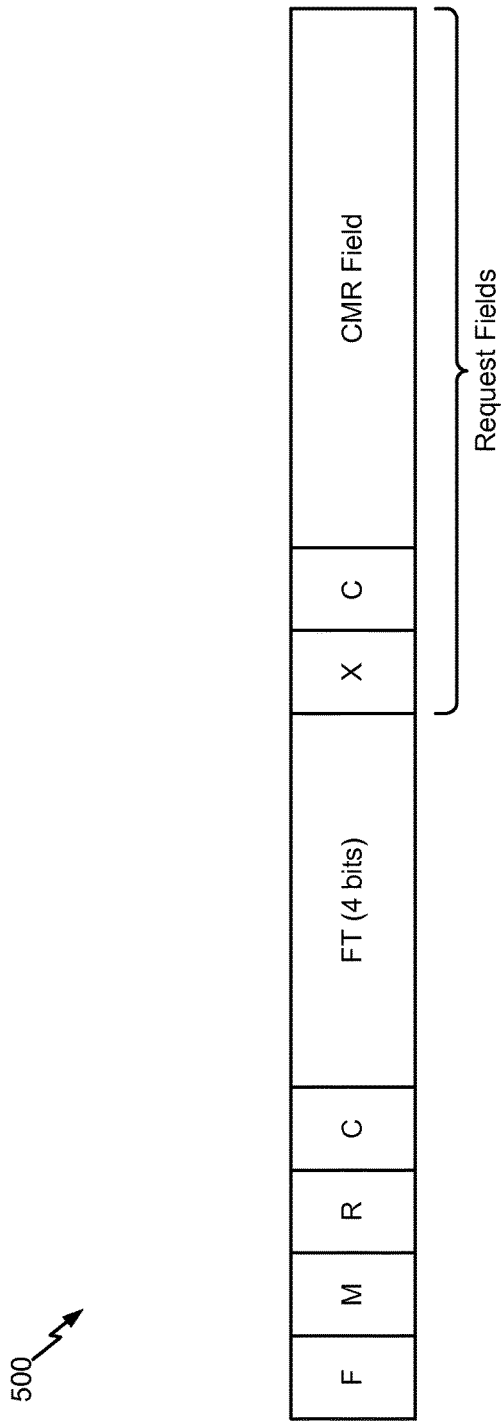
FIG. 5 is a real-time transport protocol payload header having a code mode request field that is operable to carry an offset value.

Out-of-band signaling may be performed using a mechanism such as a real-time transport control protocol (RTCP) message. For in-band signaling, the transmitter 108 may transmit the offset value 166 to the receiver 126 using a code mode request (CMR) field of a real-time transport protocol (RTP) payload header. Referring to FIG. 5, an RTP payload header 500 having a CMR field that indicates an offset value is shown. The RTP payload header 500 may be used to transmit the offset value 166 of FIG. 1 to the second device 122, such as by using in-band signaling. The RTP payload header 500 may include a first field ("F"), a second field ("M"), a third field ("R"), a fourth field ("C"), a frame type index field ("FT"), and request fields ("REQ").

The first field ("F") may be a 1-bit field. If the first field ("F") is set to "1", the first field ("F") indicates that the current frame is followed by another speech frame in the payload. Thus, another RTP header entry may follow the current entry. If the first field ("F") is set to "0", the first field ("F") indicates that the current frame is the last frame in the payload and no further header entry follows the current entry.

The second field ("M") may be a 1-bit field. If the second field ("M") is set to "0", the second field ("M") indicates that the current frame is a speech frame of an Enhanced Voice Services (EVS) coder/decoder (CODEC) mode. If the second field ("M") is set to "1", the second field ("M") indicates that the current frame is a speech frame of an Adaptive Multi-Rate Wideband (AMR-WB) mode.

The third field ("R") may be a 1-bit field. If the third field ("R") is set to "0", then the size of the RTP payload header 500 is one byte and no request fields ("REQ") follow. If the third field ("R") is set to "1", then the size of the RTP payload header 500 is two bytes and the request fields ("REQ") may be used to request particular modes or features from a sender.

The fourth field ("C") may be a 1-bit field. If the fourth field ("C") is set to "0", the fourth field ("C") indicates the use of single-channel operation modes (e.g., mono operation modes). If the fourth field ("C") is set to "1", the fourth field ("C") indicates the use of dual-channel operation modes (e.g., stereo operation modes).

The frame type index field ("FT") may be a 4-bit field. The frame type index field ("FT") may indicate the bit rate, according to Table 1, if the second field ("M") is set to "0" and the fourth field ("C") is set to "0."

TABLE 1

Bit Rate for Frame Type Index

| Frame Type Index | Bit Rate |
| --- | --- |
| 0000 | 2.0 kbps |
| 0001 | 2.8 kbps |
| 0010 | 4.0 kbps |
| 0011 | 5.6 kbps |
| 0100 | 7.2 kbps |
| 0101 | 8.0 kbps |
| 0110 | 9.6 kbps |
| 0111 | 13.2 kbps |
| 1000 | 16.4 kbps |
| 1001 | 24.4 kbps |
| 1010 | 32.0 kbps |
| 1011 | 48.0 kbps |
| 1100 | 64.0 kbps |
| 1101 | 96.0 kbps |
| 1110 | 128.0 kbps |
| 1111 | Reserved |

The request fields ("REQ") (when the third field ("R") is set to "1") includes a fifth field ("X"), a sixth field ("C"), and a CMR field. The fifth field ("X") may be a 1-bit field. If the fifth field ("X") is set to "1", the fifth field ("X") indicates that the current entry is immediately followed by bits to indicate CMR. For example, the sixth field ("C") may be reserved and the CMR field may be a 6-bit field that indicates a requested bandwidth, a CODEC type, and a bit rate according to Table 2.

TABLE 2

Information for CMR When the Fifth Field ("X") is set to "1"

| CMR Field | Bandwidth Requested | Codec | Bitrate (kb/s) |
| --- | --- | --- | --- |
| 0 | | Reserved | |
| 1 | Narrowband | EVS Native | 5.9 |
| 2 | Narrowband | EVS Native | 7.2 |
| 3 | Narrowband | EVS Native | 8.0 |
| 4 | Narrowband | EVS Native | 9.6 |
| 5 | Narrowband | EVS Native | 13.2 |
| 6 | Wideband | EVS Native | 5.9 |
| 7 | Wideband | EVS Native | 7.2 |
| 8 | Wideband | EVS Native | 8 |
| 9 | Wideband | EVS Native | 9.6 |
| 10 | Wideband | EVS Native | 13.2 |
| 11 | Wideband | EVS Native | 16.4 |
| 12 | Wideband | EVS Native | 24.4 |
| 13 | Wideband | EVS Native | 32 |
| 14 | Wideband | EVS Native | 48 |
| 15 | Wideband | EVS Native | 64 |
| 16 | Wideband | EVS Native | 96 |
| 17 | Wideband | EVS Native | 128 |
| 18 | Wideband | AMR-WB IO | 6.6 |
| 19 | Wideband | AMR-WB IO | 8.85 |
| 20 | Wideband | AMR-WB IO | 12.65 |
| 21 | Wideband | AMR-WB IO | 14.85 |
| 22 | Wideband | AMR-WB IO | 15.85 |
| 23 | Wideband | AMR-WB IO | 18.85 |
| 24 | Wideband | AMR-WB IO | 19.85 |
| 25 | Wideband | AMR-WB IO | 23.05 |
| 26 | Wideband | AMR-WB IO | 23.85 |
| 27 | Superwideband | EVS Native | 13.2 |
| 28 | Superwideband | EVS Native | 16.4 |
| 29 | Superwideband | EVS Native | 24.4 |
| 30 | Superwideband | EVS Native | 32 |
| 31 | Superwideband | EVS Native | 48 |
| 32 | Superwideband | EVS Native | 64 |
| 33 | Superwideband | EVS Native | 96 |
| 34 | Superwideband | EVS Native | 128 |
| 35 | Fullband | EVS Native | 24.4 |
| 36 | Fullband | EVS Native | 32 |
| 37 | Fullband | EVS Native | 48 |
| 38 | Fullband | EVS Native | 64 |
| 39 | Fullband | EVS Native | 96 |
| 40 | Fullband | EVS Native | 128 |
| 41-63 | | Reserved | |

If the fifth field ("X") is set to "0", then partial redundancy is requested and the current entry is immediately followed by bits to indicate the configuration of the partial redundancy mode. For example, the field ("C") may correspond to a first bit of the CMR field, and the CMR field may be a 7-bit field. The first two bits of the CMR field may be used to request a low bit rate channel mode or a high bit rate channel mode in a wideband bandwidth or a super wideband bandwidth. The remaining five bits of the CMR field may be used to request the offset value 166 of FIG. 1 (e.g., the optimum FEC offset value ($X_{opt}$)) with respect to the current frame (e.g., the first packet 160) where partial redundancy (e.g., a partial copy of the first packet data) is stored.

Referring back to FIG. 1, the receiver 126 of the second device 122 may receive the offset value 166 and provide the offset value 166 to the encoder 130. Upon reception of the offset value 166 (e.g., upon reception of the partial redundancy request and the optimum FEC offset value ($X_{opt}$) as described with respect to FIG. 4), the second device 122 may send an acknowledgment 168 to the first device 102 via the second path 154. For example, when the encoder 130 receives the offset value 166, the encoder 130 (or another processor) may generate the acknowledgement 168, and the transmitter 128 may transmit the acknowledgement 168 to the network 150 via the second reverse channel 154*a*. According to one implementation, one or more packets that include partial redundancy data transmitted from the second device 122 to the first device 102 may include the acknowledgment 168 in addition to, or instead of, sending a dedicated message to signal acknowledgment. For example, the acknowledgement 168 may be indicated using one or more payload bits, the acknowledgment 168 may be indicated using one or more "watermark" bits, or a packet may include a header that includes the acknowledgement 168. Such an acknowledgement may be provided as an indication of the offset value 166 used by the encoder 130 when adding the redundancy data of an earlier-sent packet to a later-sent packet. The decoder 114 may read the offset value 166 and compare to offset value 166 to the requested value to verify that the encoder 130 is using the requested value. The receiver 106 may receive the acknowledgement 168 from the network 150 via the first forward channel 154*b*.

Upon receiving the acknowledgement 168 at the receiver 106, the decoder 114 may use the acknowledgement 168 to find the correct partial copy of a lost packet. For example, the acknowledgement 168 may include an indication of the optimum FEC offset value ($X_{opt}$). After receiving the indication, the decoder 114 may poll the de-jitter buffer 112 for a packet having a sequence number that is offset from the sequence number of the lost packet by the optimum FEC offset value ($X_{opt}$) to find the correct partial copy of the lost packet.

The second device 122 may also acknowledge receipt of the offset value 166 by including the offset value 166 in the frame that includes the partial redundancy. Thus, the offset value 166 may be indicated in each frame with the partial redundancy to reduce a likelihood of ambiguity of determining which future frame in the de-jitter buffer 112 includes a partial redundant copy of a current lost frame. For example, the FEC offset value may be carried as exclusive bits in the frame that carries the partial redundancy. As another example, the FEC offset value may input into the bit stream as a "watermark" (e.g., watermarked into the payload of the packet that carries the partial redundancy). According to implementations where each frame containing partial redundancy also indicates the offset value 166, the decoder 114 may read the indication of the offset value 166 for each frame in the de-jitter buffer 112 to determine whether any frame corresponds to a lost packet.

The system 100 of FIG. 1 may improve speech decoding operations by increasing the likelihood of retrieving error correction data (e.g., a partial copy of a lost packet). For example, the decoder 114 may determine the offset value 166 (e.g., the optimum FEC offset value ($X_{opt}$)) of a subsequent packet that is in the de-jitter buffer 112 during an attempt to decode a lost packet. The offset value 166 may be transmitted to the second device 122 so that the second device 122 provides error correction data for each transmitted packet in a subsequent packet separated by the offset value 166. Thus, the likelihood that a subsequent packet (having error correction data for a lost packet) is in the de-jitter buffer 112 during an attempt to decode the lost packet increases, which may enable the decoder 114 to retrieve the error correction data (e.g., the partial copy of the lost packet) from the de-jitter buffer 112.

Figure 6:
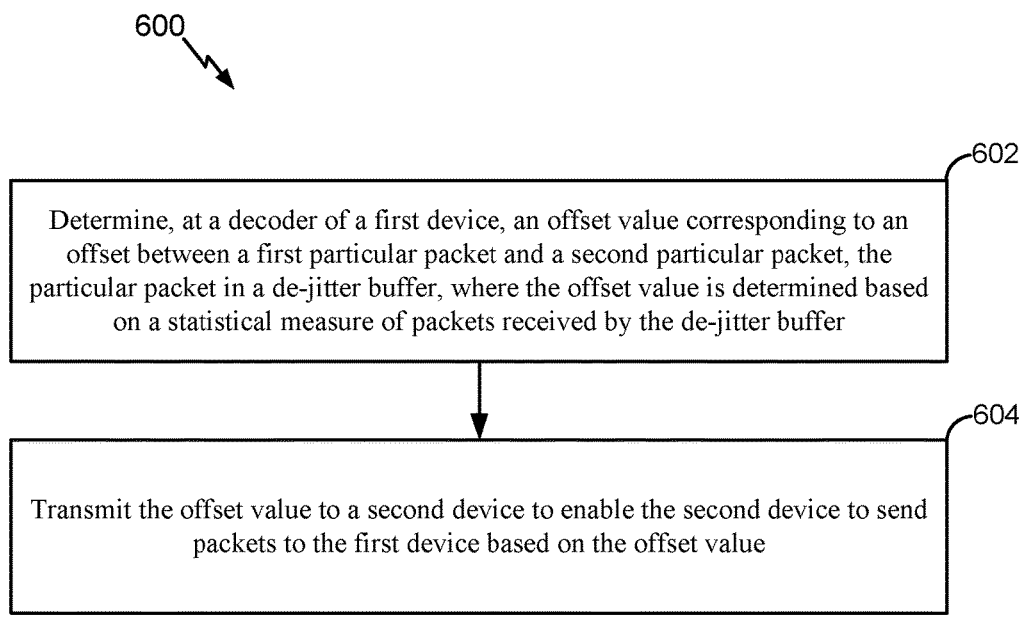
FIG. 6 is a flowchart illustrating a method of determining an offset value to retrieve partial redundancy information of a lost packet.

Referring to FIG. 6, a method 600 of determining an offset value to retrieve partial redundancy information of a lost packet is shown. The method 600 may be performed by the components within the first device 102 of FIG. 1, the second device 122 of FIG. 1, or any combination thereof.

The method 600 includes determining, at a decoder of a first device, an offset value corresponding to an offset between a first particular packet and a second particular packet, the particular packet in a de-jitter buffer, at 602. For example, the decoder 114 may determine the offset value 166 (e.g., the optimum offset value ($X_{opt}$)) based on a statistical measure of packets received by the de-jitter buffer 112.

As a non-limiting example, the decoder 114 may determine offset values between each packet stored in the de-jitter buffer 112 and the first packet 160 (e.g., the lost packet). Additionally, the decoder 114 may apply the probability mass function P(x|L), as expressed in Equation 1, to determine a probability offset values associated with packets being stored in the de-jitter buffer 112. The decoder 114 may determine the particular offset value based on a history of offset values of packets that are in the de-jitter buffer 112 upon the occurrence of lost packets.

As another non-limiting example, the decoder 114 may set the offset value 166 to a first value and determine a first probability of the particular packet (e.g., the packet that includes a partial redundant copy of the first packet 160) being stored in the de-jitter buffer 112 when the first packet 160 is lost. The decoder 114 may adjust (e.g., increment or decrement) the offset value 166 to a second value and determine a second probability of the particular packet being stored in the de-jitter buffer 112 when the first packet 160 is lost. The offset value 166 may be set to be the value with the largest determined probability based on multiple trial offset values. For example, the offset value 166 may be equal to the first value if the first probability is greater than the second probability, and the offset value 166 may be equal to the second value if the second probability is greater than the first probability. As another non-limiting example, the decoder 114 may predict the offset value 166 using a prediction model (e.g., a hidden Markov model or a Bayesian network) and channel characteristics between the first device 102 and the second device 122, as described with respect to FIG. 4.

The offset value may be transmitted to a second device to enable the second device to send packets to the first device based on the offset value, at 506. For example, referring to FIG. 1, the transmitter 108 may transmit the offset value 166 to the receiver 126 of the second device 122 via the first path 152, and the receiver 126 may provide the offset value 166 to the encoder 130. To illustrate, the transmitter 108 may transmit the offset value 166 to the network 150 via the first reverse channel 152*a*, and the receiver 126 may receive the offset value 166 from the network 150 via the second forward channel 152*b*. The offset value 166 instructs the encoder 130 of the second device 122 to construct packets so that a later sent packet includes error correction data of an earlier sent packet based on the offset value 166. The error correction data may include a copy of the earlier sent packet or a partial copy of the earlier sent packet.

The method 600 of FIG. 6 may improve speech decoding operations by increasing the likelihood of retrieving error correction data (e.g., a partial copy of a lost packet). For example, the decoder 114 may determine the offset value 166 (e.g., the optimum FEC offset value ($X_{opt}$)) of a subsequent packet that is in the de-jitter buffer 112 during an attempt to decode a lost packet. The offset value 166 may be transmitted to the second device 122 so that the second device 122 provides error correction data for each transmitted packet in a subsequent packet separated by the offset value 166. Thus, the likelihood that a subsequent packet (having error correction data for a lost packet) is in the de-jitter buffer 112 increases, which may enable the decoder 114 to retrieve the error correction data (e.g., the partial copy of the lost packet) from the de-jitter buffer 112.

The method 600 of FIG. 6 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 600 of FIG. 6 may be performed by a processor that executes instructions, as described with respect to FIG. 7.

Figure 7:
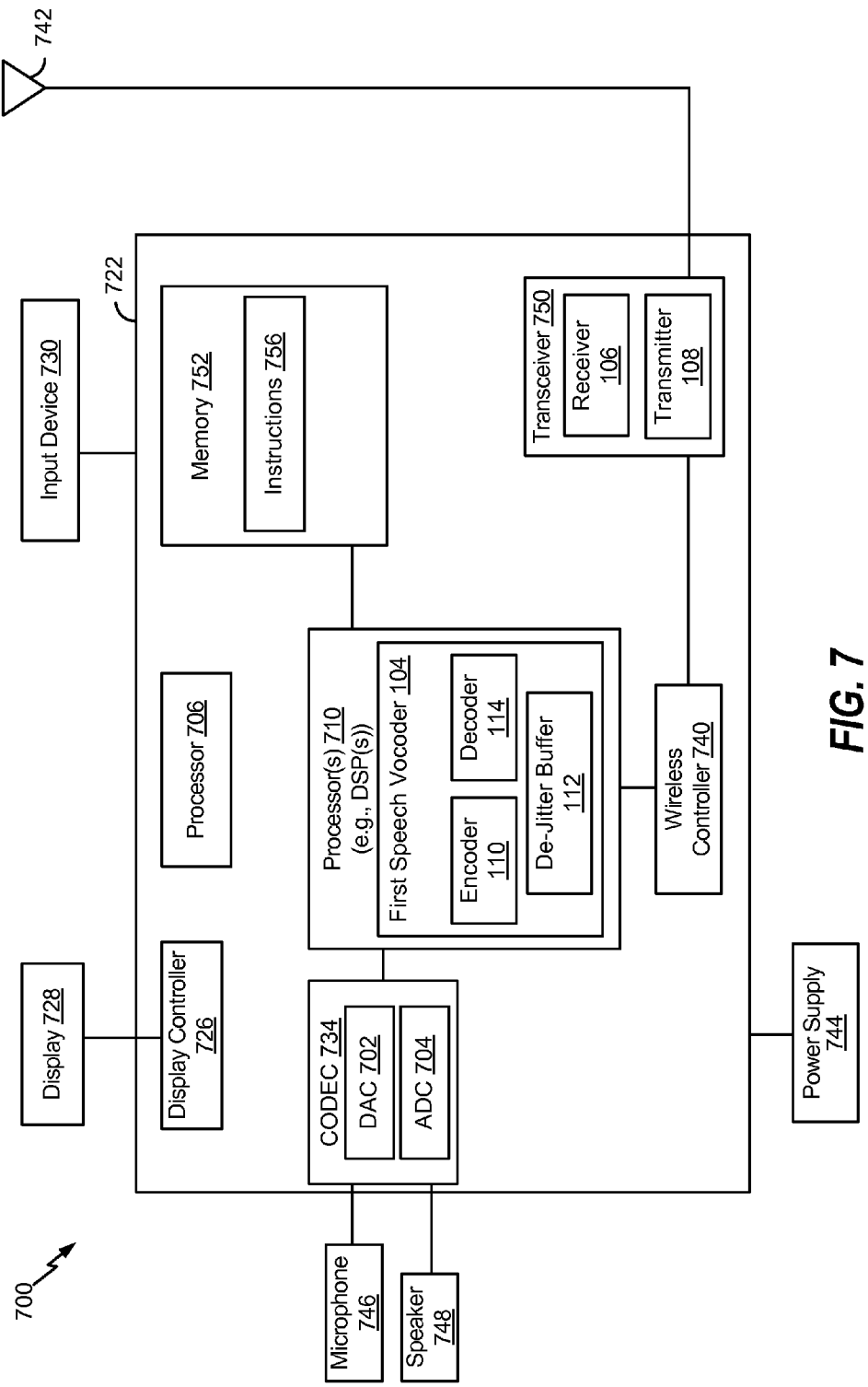
FIG. 7 is a block diagram of a device that is operable to determine an offset value to retrieve partial redundancy information of a lost packet.

Referring to FIG. 7, a device 700 (e.g., a wireless communication device) that is operable to determine an offset value to retrieve partial redundancy information of a lost packet is shown. In other implementations, the device 700 may have more or fewer components than illustrated in FIG. 7. The device 700 may correspond to the first device 102 of FIG. 1, the second device 122 of FIG. 1, or both. The device 700 may operate according to the method 600 of FIG. 6.

The device 700 includes a processor 706 (e.g., a CPU). The device 700 may include one or more additional processors 710 (e.g., one or more DSPs). The processors 710 may include the first speech vocoder 104. In an alternate implementation, the first speech vocoder 104 may be included in a different type of processor, such as a CPU (e.g., the processor 706).

The device 700 may include a memory 752 and a CODEC 734. The memory 752 may include instructions 756 that are executable by the processor 710. The device 700 may include a wireless controller 740 coupled, via a transceiver 750, to an antenna 742. The transceiver 750 may include the receiver 106, the transmitter 108, or both, of FIG. 1.

The device 700 may include a display 728 coupled to a display controller 726. The device 700 may also include a microphone 746 and a speaker 748 coupled to the CODEC 734. The CODEC 734 may include a digital-to-analog converter 702 and an analog-to-digital converter 704. The CODEC 734 may receive analog signals from the microphone 746, convert the analog signals to digital signals using the analog-to-digital converter 704, and provide the digital signals to the first speech vocoder 104. The first speech vocoder 104 may process the digital signals. The first speech vocoder 104 may provide digital signals to the CODEC 734. The CODEC 734 may convert the digital signals to analog signals using the digital-to-analog converter 702 and may provide the analog signals to the speaker 748. The CODEC 734 represents an analog front-end for audio processing that performs functions such as gain control and parameter adjustment.

The first speech vocoder 104 may include the encoder 110, the de-jitter buffer 112, and the decoder 114. The decoder 114 and the de-jitter buffer 112 may be used to implement a hardware that performs the offset determination techniques as described herein. Alternatively, or in addition, a software implementation (or combined software/hardware implementation) may be used. For example, the memory 752 may include instructions 756 executable by the processors 710 or other processing unit of the device 700 (e.g., the processor 706, the CODEC 734, or both) to perform the method 600 of FIG. 6.

The device 700 may be included in a system-in-package or system-on-chip device 722. The memory 752, the processor 706, the processors 710, the display controller 726, the CODEC 734, and the wireless controller 740 may be included in a system-in-package or system-on-chip device 722. An input device 730 and a power supply 744 may be coupled to the system-on-chip device 722. Moreover, as illustrated in FIG. 7, the display 728, the input device 730, the speaker 748, the microphone 746, the antenna 742, and the power supply 744 may be external to the system-on-chip device 722. Each of the display 728, the input device 730, the speaker 748, the microphone 746, the antenna 742, and the power supply 744 may be coupled to a component of the system-on-chip device 722, such as an interface or a controller.

The device 700 may include a mobile communication device, a smart phone, a cellular phone, a laptop computer, a computer, a tablet, a PDA, a display device, a television, a gaming console, a music player, a radio, a digital video player, a DVD player, a tuner, a camera, a navigation device, or any combination thereof.

In conjunction with the described implementations, a device may include means for determining an offset value corresponding to an offset between a first particular packet and a second particular packet, the particular packet in a de-jitter buffer. The offset value may be determined based on a statistical measure of packets received by the de-jitter buffer. For example, the means for determining the particular offset may include the decoder 114 of FIGS. 1 and 7, the decoder 134 of FIG. 1, the processor 706 of FIG. 7, the processors 710 of FIG. 7, the CODEC 734 of FIG. 7, or any combination thereof.

The device may also include means for transmitting the offset value to a second device to enable the second device to send packets to the device based on the offset value. The device may receive the packets via a forward channel. For example, the means for transmitting may include the transmitter 108 of FIGS. 1 and 7, the transmitter 128 of FIG. 1, the transceiver 750 of FIG. 7, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, such implementation decisions are not to be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein and is to be accorded the widest scope possible consistent with the principles and novel features as defined by the following claims.

What is claimed is:

1. A method comprising:
   determining, at a decoder of a first device, an offset value corresponding to an offset between a first particular packet and a second particular packet, wherein the first device includes a de-jitter buffer; and
   transmitting the offset value to a second device to enable the second device to send packets to the first device based on the offset value, wherein the offset value is transmitted via a reverse channel using in-band signaling or out-of-band signaling, and
   wherein, when in-band signaling is used to transmit the offset value, the offset value is transmitted using a code mode request (CMR) field of a real-time transport protocol (RTP) payload header.

2. The method of claim 1, wherein, based on the offset value, the second device constructs the packets so that a later sent packet includes error correction data of an earlier sent packet based on the offset value.

3. The method of claim 2, wherein the error correction data includes a partial copy of the earlier sent packet.

4. The method of claim 1, further comprising receiving, at the decoder of the first device, an acknowledgment of receipt of the offset value by the second device.

5. The method of claim 4, wherein the acknowledgment of receipt is included in one or more packets including partial redundancy data received from the second device.

6. The method of claim 4, wherein one or more payload bits of a packet received from the second device includes the acknowledgement of receipt.

7. The method of claim 4, wherein one or more watermark bits of a packet received from the second device includes the acknowledgement of receipt.

8. The method of claim 4, wherein a header of a packet received from the second device includes the acknowledgement of receipt.

9. The method of claim 4, wherein the acknowledgment of receipt is provided as an indication of the offset value.

10. The method of claim 1, wherein the offset value corresponds to a forward error correction (FEC) offset value.

11. The method of claim 1, further comprising receiving the packets via a forward channel.

12. The method of claim 1, wherein the decoder is included in a speech vocoder.

13. The method of claim 1, wherein the offset value is determined based on a statistical measure of packets received by the de jitter buffer.

14. The method of claim 1, wherein determining the offset value comprises determining a particular offset value by:
    determining offset values between each packet stored in the de-jitter buffer and the first particular packet; and
    determining a probability mass function based on a history of de-jitter buffer contents to determine a probability of the de jitter buffer including packets having offset values associated with a lost packet;
    wherein the particular offset value is based on the probability mass function.

15. The method of claim 1, wherein two bits are allocated in a packet that is transmitted to the second device to indicate the offset value.

16. The method of claim 15, wherein the two bits indicate that the offset value is equal to two, three, five, or seven.

17. A device comprising:
    a de jitter buffer configured to store one or more packets;
    a decoder configured to determine an offset value corresponding to an offset between a first particular packet and a second particular packet; and
    a transmitter configured to transmit the offset value to a second device to enable the second device to send packets to the device based on the offset value, wherein the offset value is transmitted via a reverse channel using in-band signaling or out-of-band signaling, and
    wherein, when in-band signaling is used to transmit the offset value, the offset value is transmitted using a code mode request (CMR) field of a real-time transport protocol (RTP) payload header.

18. The device of claim 17, wherein, based on the offset value, the second device constructs the packets so that a later sent packet includes error correction data of an earlier sent packet based on the offset value.

19. The device of claim 18, wherein the error correction data includes a partial copy of the earlier sent packet.

20. The device of claim 17, wherein the decoder is further configured to receive from the second device an acknowledgment of receipt of the offset value.

21. The device of claim 20, wherein the acknowledgment of receipt is included in one or more packets that are received from the second device and that include partial redundancy data.

22. The device of claim 17, wherein the offset value is determined based on a statistical measure of packets received by the de jitter buffer.

23. The device of claim 17, wherein the offset value corresponds to a forward error correction (FEC) offset value.

24. The device of claim 17, wherein determining the offset value comprises determining a particular offset value by:
    determining offset values between each packet stored in the de jitter buffer and the first particular packet; and
    determining a probability mass function based on a history of de-jitter buffer contents to determine a probability of the de-jitter buffer including packets having offset values associated with a lost packet;
    wherein the particular offset value is based on the probability mass function.

25. The device of claim 17, wherein two bits are allocated in a packet that is transmitted to the second device to indicate the offset value.

26. The device of claim 25, wherein the two bits indicate that the offset value is equal to two, three, five, or seven.

27. A non-transitory computer-readable medium comprising instructions that, when executed by a first device, causes the first device to:
    determine an offset value corresponding to an offset between a first particular packet and a second particular packet, wherein the first device includes a de jitter buffer; and
    transmit the offset value to a second device to enable the second device to send packets to the first device based on the offset value, wherein the offset value is transmitted via a reverse channel using in-band signaling or out-of-band signaling, and
    wherein, when in-band signaling is used to transmit the offset value, the offset value is transmitted using a code mode request (CMR) field of a real-time transport protocol (RTP) payload header.

28. The non-transitory computer-readable medium of claim 27, wherein the offset value instructs the second device to construct the packets so that a later sent packet includes error correction data of an earlier sent packet based on the offset value.

29. The non-transitory computer-readable medium of claim 28, wherein the error correction data includes a partial copy of the earlier sent packet.

30. The non-transitory computer-readable medium of claim 27, wherein the first device receives from the second device an acknowledgment of receipt of the offset value.

31. The non-transitory computer-readable medium of claim 30, wherein the acknowledgment of receipt is included in one or more packets that are received from the second device and that include partial redundancy data.

32. The non-transitory computer-readable medium of claim 27, wherein the offset value is determined based on a statistical measure of packets received by the de jitter buffer.

33. The non-transitory computer-readable medium of claim 27, wherein the offset value corresponds to a forward error correction (FEC) offset value.

34. The non-transitory computer-readable medium of claim 27, wherein determining the offset value comprises determining a particular offset value by:
   determining offset values between each packet stored in the de-jitter buffer and the first particular packet; and
   determining a probability mass function based on a history of de-jitter buffer contents to determine a probability of the de-jitter buffer including packets having offset values associated with a lost packet;
   wherein the particular offset value is based on the probability mass function.

35. The non-transitory computer-readable medium of claim 34, wherein two bits are allocated in a packet that is transmitted to the second device to indicate the offset value.

36. The non-transitory computer-readable medium of claim 35, wherein the two bits indicate that the offset value is equal to two, three, five, or seven.

37. A device comprising:
   means for storing one or more packets;
   means for determining an offset value corresponding to an offset between a first particular packet and a second particular packet; and
   means for transmitting the offset value to a second device to enable the second device to send packets to the device based on the offset value, wherein the offset value is transmitted via a reverse channel using in-band signaling or out-of-band signaling, and
   wherein, when in-band signaling is used to transmit the offset value, the offset value is transmitted using a code mode request (CMR) field of a real-time transport protocol (RTP) payload header.

38. The device of claim 37, wherein, based on the offset value, the second device constructs the packets so that a later sent packet includes error correction data of an earlier sent packet based on the offset value.

39. The device of claim 38, wherein the error correction data includes a partial copy of the earlier sent packet.

40. The device of claim 37, further comprising means for receiving an acknowledgment of receipt of the offset value from the second device.

41. The device of claim 40, wherein the acknowledgment of receipt is included in one or more packets that are received from the second device and that include partial redundancy data.

* * * * *